US011460504B2

(12) United States Patent
Zhang

(10) Patent No.: US 11,460,504 B2
(45) Date of Patent: Oct. 4, 2022

(54) MULTI-CHAMBER, EXPLOSION-PROOF, BATTERY-TESTING APPARATUS

(71) Applicant: Chaojiong Zhang, College Station, TX (US)

(72) Inventor: Chaojiong Zhang, College Station, TX (US)

(*) Notice: Subject to any disclaimer, the term of this patent is extended or adjusted under 35 U.S.C. 154(b) by 656 days.

(21) Appl. No.: 16/509,685

(22) Filed: Jul. 12, 2019

(65) Prior Publication Data

US 2020/0064407 A1 Feb. 27, 2020

Related U.S. Application Data

(60) Provisional application No. 62/817,326, filed on Mar. 12, 2019.

(30) Foreign Application Priority Data

Aug. 27, 2018 (CN) .......................... 201810978190.2
Aug. 27, 2018 (CN) .......................... 201821380223.5

(51) Int. Cl.
*G01R 31/36* (2020.01)
*G12B 17/08* (2006.01)
*G01R 31/371* (2019.01)
*G01R 31/385* (2019.01)
*G01R 1/04* (2006.01)
*G01R 1/44* (2006.01)

(52) U.S. Cl.
CPC ........... *G01R 31/3644* (2013.01); *G01R 1/04* (2013.01); *G01R 31/371* (2019.01); *G01R 31/385* (2019.01); *G12B 17/08* (2013.01); *G01R 1/44* (2013.01)

(58) Field of Classification Search
None
See application file for complete search history.

(56) References Cited

U.S. PATENT DOCUMENTS

| | | | |
|---|---|---|---|
| 5,903,154 A | 5/1999 | Zhang et al. | |
| 5,914,609 A * | 6/1999 | Curry .................... | H02J 7/0013 324/601 |
| 5,966,014 A | 10/1999 | Zhang et al. | |
| 6,291,972 B1 | 9/2001 | Zhang | |
| 6,304,449 B1 | 10/2001 | Zhang | |

(Continued)

*Primary Examiner* — Jas A Sanghera
(74) *Attorney, Agent, or Firm* — Stephen S. Hodgson

(57) ABSTRACT

A cabinet box comprises a plurality of independent, explosion-proof chambers. A battery wiring assembly for receiving and testing a battery is attached to an inner wall of an explosion-proof door, and an electrical connector is provided on an outer wall of the door. The assembly is placed inside a chamber, and the door seals the chamber. The temperature in each chamber is controlled independently, allowing batteries to be tested simultaneously at different temperatures. An air-circulating temperature-control module can be in a chamber, or a temperature controller with a refrigeration sheet can be integrated with the battery wiring assembly for direct battery contact. Separate, independent explosion-proof chambers effectively eliminate the possibility of a battery explosion in one chamber causing a chain-reaction explosion in another chamber. Modularity allows damaged parts to be replaced easily. An external battery testing machine can connected to the connector on each door.

36 Claims, 6 Drawing Sheets

(56) References Cited

U.S. PATENT DOCUMENTS

| | | | |
|---|---|---|---|
| 6,533,031 B1 * | 3/2003 | Garcia | H01M 10/658 |
| | | | 165/59 |
| 6,936,372 B1 * | 8/2005 | Jagota | H01M 10/633 |
| | | | 429/50 |
| 7,614,907 B2 | 11/2009 | Zhang | |
| 10,161,963 B2 | 12/2018 | Zhang | |
| 2004/0079714 A1 * | 4/2004 | Andrew | H01M 50/20 |
| | | | 211/49.1 |
| 2012/0125129 A1 * | 5/2012 | Dallinger | H01M 10/4285 |
| | | | 73/865.6 |
| 2012/0176080 A1 * | 7/2012 | Uchihashi | A62C 3/16 |
| | | | 320/101 |
| 2017/0301967 A1 * | 10/2017 | Kim | H01M 10/63 |

* cited by examiner

Fig. 7
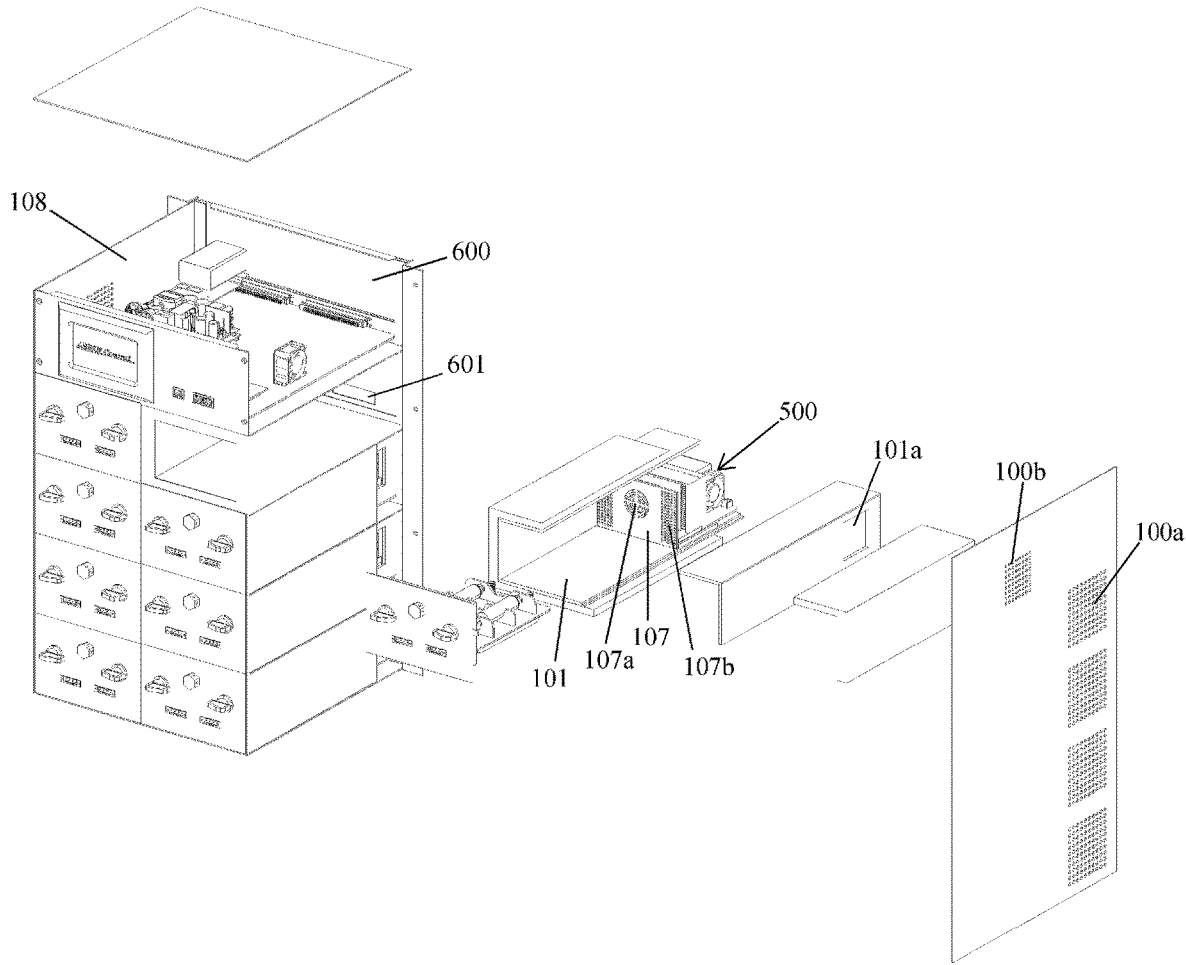
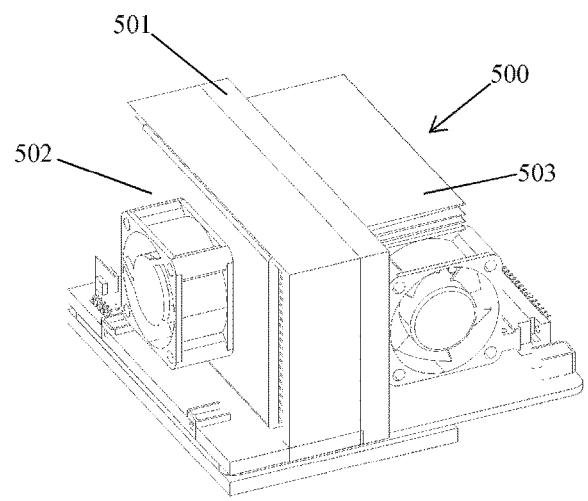
Fig. 8

MULTI-CHAMBER, EXPLOSION-PROOF, BATTERY-TESTING APPARATUS

CROSS-REFERENCE TO RELATED APPLICATIONS

This application claims priority to Chinese Invention Patent Application No. 201810978190.2 and to Chinese Utility Model Application No. 201821380223.5, both of which were filed on Aug. 27, 2018, and each of which is incorporated by reference. This application also claims priority to U.S. Provisional Patent Application No. 62/817,326 filed on Mar. 12, 2019, which is incorporated by reference.

BACKGROUND OF THE INVENTION

1. Field of the Invention

This patent application pertains to battery testing, and more particularly to a multi-chamber, independent, explosion-proof, fireproof, isolation box in which batteries are placed for testing so that a battery explosion is contained within one chamber without disrupting testing in other chambers within the box. The temperature in each chamber is controlled independently of other chambers within the box.

2. Description of the Related Art

Batteries are being used more and more frequently in people's daily lives. Batteries generally need to be tested before use to determine whether they are up to standard, including voltage internal resistance, capacity, overcharge, over discharge, and short circuit tests. During the tests, the batteries may explode, burn, and even endanger the safety of the workers. Therefore, when testing batteries, protection measures are needed, such as an explosion-proof safety test box. Existing test boxes are generally one large box, and many batteries are placed together in the box. If an abnormality such as an explosion or burning occurs in the testing of the charge and discharge of any individual battery, it will damage adjacent batteries and equipment within the box. In addition, existing test boxes can only regulate the internal temperature of the one single cabinet, and cannot meet the specific environmental temperature required for different types of batteries or different temperature conditions on the same type of batteries. Therefore, the requirements for running tests on batteries in different temperature environments cannot be performed at the same time, which greatly reduces work efficiency. At the same time, the wiring in the existing test boxes is complicated. Each battery holder in the box needs to be connected by a wire or cable, which is inserted through wiring channels on the side walls of the box, and then connected to the battery holders one by one. Connecting the wiring is very cumbersome, and wires can easily get crisscrossed.

SUMMARY OF THE INVENTION

A battery testing apparatus is provided that includes a box having opposing front and back sides, opposing top and bottom sides, opposing left and right sides and inside dividing walls, where the inside dividing walls and the sides of the box define at least one chamber and preferably at least two chambers. The box preferably includes a skeletal frame, and the front side of the box is generally open. A separate, and preferably hingeless, door, encloses each chamber. A battery testing apparatus is mounted directly or indirectly to each door and received within its respective chamber. The battery testing apparatus preferably includes at least one latch for each door for fastening each door to the box, preferably where each door has an inside wall that defines a front side of its respective chamber and an opposing outside wall, preferably where each battery testing apparatus is attached directly or indirectly to the inside wall of its respective door, preferably where each battery testing apparatus comprises a battery wiring assembly that includes a battery holder, a circuit board, a first terminal for connecting a battery to the circuit board, a second terminal connected to the circuit board and mounted directly or indirectly to the inside wall of its respective door and a socket mounted on or received in the outside wall of its respective door, preferably where the socket is electrically connected to the second terminal and thereby electrically connected to the circuit board and the first terminal, thereby providing an electrical connection between a battery testing machine located outside of the box and a battery received in the battery holder, preferably where the door, the side walls of the box and the inside dividing walls define the respective chamber for the door and are resistant to damage from an explosive event during testing of a battery in the respective chamber, and preferably where an explosive event or a fire in one chamber does not affect another chamber. The battery testing apparatus preferably further includes means for regulating and controlling the temperature in each chamber, preferably where each chamber can be maintained at a separate and different temperature.

BRIEF DESCRIPTION OF THE INVENTION

The present invention provides an integrated and modular multi-chamber, independent, explosion-proof, fireproof, isolation box capable of performing isolated tests on individual batteries to prevent an explosion in a single independent explosion-proof chamber from affecting batteries being tested in other chambers in the same box. The present invention provides an integrated and modular multi-chamber, independent, explosion-proof, fireproof, isolated temperature control box in which the temperature in each explosion-proof chamber is regulated independently. The present invention also provides an integrated and modular multi-chamber, independent, explosion-proof, fireproof, isolated, cooling-plate box, which provides more efficient temperature control of batteries in each explosion-proof chamber.

The multi-chamber, independent, explosion-proof, fireproof, isolation box includes a box body, within which are multiple independent explosion-proof chambers, and each of the explosion-proof chambers includes an explosion-proof door. A battery wiring assembly is fixed on the inner side wall of each explosion-proof door. A plurality of independent explosion-proof chambers are arranged within the box body, and each explosion-proof chamber is isolated from each other without interference, thereby limiting damage in an unexpected situation that would otherwise result in a chain reaction. The battery wiring assembly can be set up for different models, sizes and types of batteries. By replacing the battery wiring assembly in the explosion-proof chambers, batteries of different sizes, models and types can be tested. The battery wiring assembly and the explosion-proof door are integrated into one body, and the battery in each explosion-proof chamber can be replaced independently without interfering with ongoing tests in other explosion-proof chambers.

Regarding the explosion-proof doors, one may generally think of a door as being hinged or being mounted with hinges, but the doors of the present invention are preferably not hinged. An explosion-proof door and its battery wiring assembly is more like a drawer that slides into a cabinet, where the cabinet has multiple compartments or chambers for receiving multiple drawers. The structure of the box body, the explosion-proof chambers and the explosion-proof doors with battery wiring assemblies can be compared to a kitchen cabinet that has multiple drawers. A kitchen cabinet for several drawers can be described as a cabinet box with several compartments for receiving drawers. A drawer for the kitchen cabinet can be described as including a drawer box and a front panel on one side of the box. The drawer is slid into one of the compartments such that the drawer box is received inside the compartment, and the front panel of the drawer abuts the cabinet box. If a drawer includes a drawer box and a front panel on one side of the box, then in the present invention, the battery wiring assembly can be thought of as the drawer box, and the explosion-proof door can be thought of as the front panel. The box body of the present invention can be thought of as the cabinet box. The explosion-proof chambers can be thought of as the compartments in a kitchen cabinet that receive the drawers.

The box body of the present invention preferably has opposing front and back sides, opposing top and bottom sides, opposing left and right sides and inside dividing walls, where the inside dividing walls and the sides of the box define at least two chambers, and where the front side of the box is generally open. The box body may include two, four, six, eight or more chambers including an odd number of chambers. Each of the explosion-proof chambers preferably has a volume of less than 5 dm 3, and preferably, there are preferably no fewer than two explosion-proof chambers per safety test box, thereby fully utilizing the internal cabinet space of the safety test box. The integrated and modular design also allows for more flexibility and maneuverability.

The battery wiring assembly includes a first connection terminal with a supporting circuit board and a second terminal for connecting an external test line through a socket on the outer side of the explosion-proof door. By arranging the socket of the second terminal on the outer side of the explosion-proof door, it ensures airtightness within the explosion-proof chamber. Furthermore, a sealing strip can be placed along the edge inside of all the explosion-proof doors. Upon closing the door, pressure on the seal completely seals off the explosion-proof chamber, so any battery fire can be quickly extinguished due to the exhaustion of oxygen.

The second terminal is situated on the inner side of the explosion-proof door, and the socket portion of the second terminal is mounted in a window opening on the explosion-proof door. After a battery is installed on the battery wiring assembly, the battery wiring assembly is slid into a chamber until the explosion-proof door closes against the frame around or the front side of the chamber, thereby placing the battery in a sealed chamber. After the battery is inserted into the explosion-proof chamber, a wire or cable can be plugged directly into the second terminal through the socket located on the outer wall of the explosion-proof door, thereby making wiring very convenient and also substantially reducing the probability of wiring errors.

The present invention also provides a multi-chamber, independent, explosion-proof, fireproof, isolated temperature control box. In addition to the test box described above, a temperature adjusting device is separately provided in each explosion-proof chamber so that the temperature in each explosion-proof chamber can be independently controlled, and multiple batteries needing different temperature requirements can be tested at the same time, which greatly improves the efficiency of the battery tests.

Each explosion-proof door is preferably provided with a pressure relief valve. When an explosion occurs in the explosion-proof chamber, the pressure in the explosion-proof chamber is sharply increased, and the pressure relief valve can be used to relieve pressure, thereby effectively reducing the damage caused by the explosion. A left and a right rotary lock are disposed on the explosion-proof door, and each rotary lock includes a main body portion and a rotating locking lever. The main body portion is mounted on the explosion-proof door, and the rotating knob on the main body portion controls the locking mechanism of the rotating locking lever, thereby locking the explosion-proof door.

A sealing and insulating layer is preferably disposed on the inner side of the explosion-proof door to maintain temperature. Vent holes are arranged on the sealing and insulating layer, which are connected to or in fluid communication with the pressure relief valve to allow timely, immediate pressure relief when an explosion occurs. An air deflector is installed in the explosion-proof chamber, which separates the temperature adjusting device and the battery wiring assembly.

In one embodiment, the temperature adjusting device is an air conditioning device, such as a semiconductor refrigeration sheet; and the air deflector is provided with an inlet grille and an outlet grille. A heat exchange port is positioned on the sidewall of the explosion-proof chamber for outward heat exchange of the air conditioning device. A temperature control wiring board is installed in the back of the test box away from the explosion-proof door, preferably vertically on the back side of the box body. The temperature control wiring board is provided with multiple wiring ports, to which the temperature adjusting device is plugged into. To install the temperature adjustment device, one simply removes the explosion-proof door and the battery wiring assembly and then slides the temperature adjustment device into the explosion-proof chamber and plugs it into the corresponding wiring port. In this way, if the temperature adjustment device is damaged, it can be quickly replaced.

In order to improve the compactness and stability of the overall structure, the temperature adjustment device can be configured as a semiconductor refrigeration sheet. In comparison to other forms of temperature adjustment devices, this design can reduce the overall volume, improve space utilization, be easily assembled, and be convenient to carry.

The present invention also discloses a multi-chamber, independent, explosion-proof, fireproof, isolated, cooling-plate box, which is different from the above-mentioned temperature control box in that the temperature regulating device comprises a semiconductor refrigeration sheet, which can be located close to, but away from, the explosion-proof door. The tested battery can directly contact the cooling plate, which can substantially improve the heat exchange efficiency.

In addition, the cooling plate device is preferably fixedly mounted on a side of the battery wiring assembly away from the explosion-proof door, thereby forming a modular fixed structure with the explosion-proof door and the battery wiring assembly. Simultaneously, the cooling plate device is preferably connected to the circuit board; the battery wiring assembly preferably includes a third connection terminal for plugging into a connection port, whereby the cooling plate device is preferably connected to the temperature control wiring board. The modular combined structure of the explosion-proof door, the battery wiring assembly and the cooling plate device is preferably connected to the temperature control wiring board through the third terminal. Furthermore, the third terminal is mounted on the back side of the circuit board away from the explosion-proof door and is located at a position aligned with the wiring port. The modular fixed structure can be directly fed into the explosion-proof chamber, and the third terminal can be directly connected to the wiring port.

The surface on the side of the cooling plate facing the explosion-proof door is preferably an inclined surface, and a heat dissipation grille is preferably disposed on the inclined surface. The lower end of the metal cooling plate is preferably fixed to the circuit board, and the arrangement of the inclined surface increases the heat conduction area, which is more favorable for heat conduction to the horizontal plate of the cooling plate, thereby further improving the heat exchange efficiency.

The cooling plate further includes a horizontal plate extending toward and close to the door. Through this structure, a very effective heat conduction surface can be provided to the battery under test, and the tested battery can be directly in contact with the heat conduction surface to exchange heat directly, which is more efficient than indirect heat exchanged through air as a heat conduction medium through the temperature control box. The heat conduction surface is not limited to flat surfaces. The cooling plate can also be shaped to form a cavity for the tested battery, which increases the surface area through which a battery can directly exchange heat. If an explosion occurs in a single explosion-proof chamber, and the corresponding explosion-proof door, battery wiring assembly and cooling plate device are all damaged, the assembly can be modularly disassembled and replaced. Since the cooling plate is made of a metal material, the explosion inside the explosion-proof chamber can be effectively prevented from affecting the temperature control wiring board on the rear side of the chamber.

Compared with the existing technology, the present invention provides a plurality of independent, small, explosion-proof chambers, which are isolated from each other and independent of each other, which can effectively limit the chain reaction and the expansion of damages in an unexpected situation, limiting loss, and improving safety in battery testing. At the same time, independent temperature control of each explosion-proof chamber greatly improves the testing efficiency of the temperature control box and the cooling box, and the modular structure can also effectively improve recovery from an explosion and wiring efficiency and can reduce wiring errors.

A single-chamber, explosion-proof box that employs the advantages and benefits for battery testing that are disclosed herein is also within the scope of the present invention. One embodiment of the present invention is a battery testing apparatus, comprising: a box having opposing front and back sides, opposing top and bottom sides, opposing left and right sides that define a chamber, where the front side of the box and the chamber is generally open; a door for the chamber, wherein the door abuts or slides into the front side of the box and seals the chamber; a battery testing apparatus mounted directly or indirectly to the door, where the battery testing apparatus is received within the chamber; and a latch for fastening the door to the box and sealing the chamber. The temperature control devices, the electrical connectivity and the modularity described herein can be used to make and use the single-chamber, explosion-proof box.

BRIEF DESCRIPTION OF THE DRAWINGS

FIG. 7 is an exploded view of the multi-chamber temperature control box of FIG. 5.

FIG. 8 is a perspective view of a temperature adjusting device used in a chamber in the multi-chamber temperature control box of FIG. 5, according to the present invention.

DETAILED DESCRIPTION OF THE EXEMPLARY EMBODIMENTS

Figure 1:
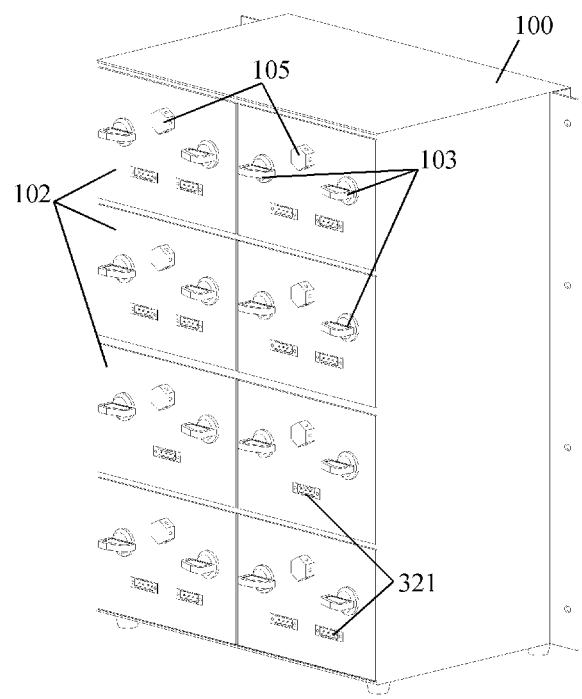
FIG. 1 is a perspective view of a multi-chamber, independent, explosion-proof, fireproof, isolation box, according to the present invention.

The invention and specific embodiments thereof will be further described in detail below with reference to the drawings. With reference to FIGS. 1-4, one embodiment of the present invention provides a multi-chamber, independent, explosion-proof, fireproof, isolation box, which includes a box 100. Box 100 has opposing front and back sides, opposing top and bottom sides, opposing left and right sides and inside dividing walls. The inside dividing walls and the sides of the box define a plurality of chambers. The front side of the box is generally open with an open framework around the chambers. A plurality of independent, explosion-proof chambers 101 are arranged in the box 100. An explosion-proof door 102 encloses each chamber 101. The explosion-proof door 102 is provided with two left and right rotary locks 103. With reference to FIG. 4, rotary lock 103 includes a main body portion 103a and a rotating locking lever 103b. The main body portion 103a is mounted on the explosion-proof door 102. The rotation of the locking lever 103b can be controlled by rotating the rotary handle on the main body portion 103a so that the lever portion 103b can be caught on the inner wall of a frame that defines a front opening of the explosion-proof chamber 101.

The box body 100 is preferably constructed of thin metal which has good explosion-proof capabilities. One may first construct a skeletal frame using angle bar and T-bar and then attach sheets to the frame. A variety of materials may be suitable for making the box body 100. One may begin this review by investigating stainless steel sheet metal. A stainless steel of the austenitic type, possibly series AISI 304 and/or AISI 316, may be suitable. A 3 mm thick ferrous iron sheet may be suitable, provided it has a suitable tensile strength, possible greater than 400 Mpa. A 1.5 mm thick sheet of stainless steel SS304 with a tensile strength of at least 500 Mpa may be suitable. It may also be possible to use a plastic material that has the strength to withstand the explosion of a battery. A plurality of independent, explosion-proof chambers 101 are arranged within the box body 100. The explosion-proof chambers 101 are isolated from each other without interference, thereby limiting damage resulting from a chain reaction in an unexpected situation.

Figure 3:
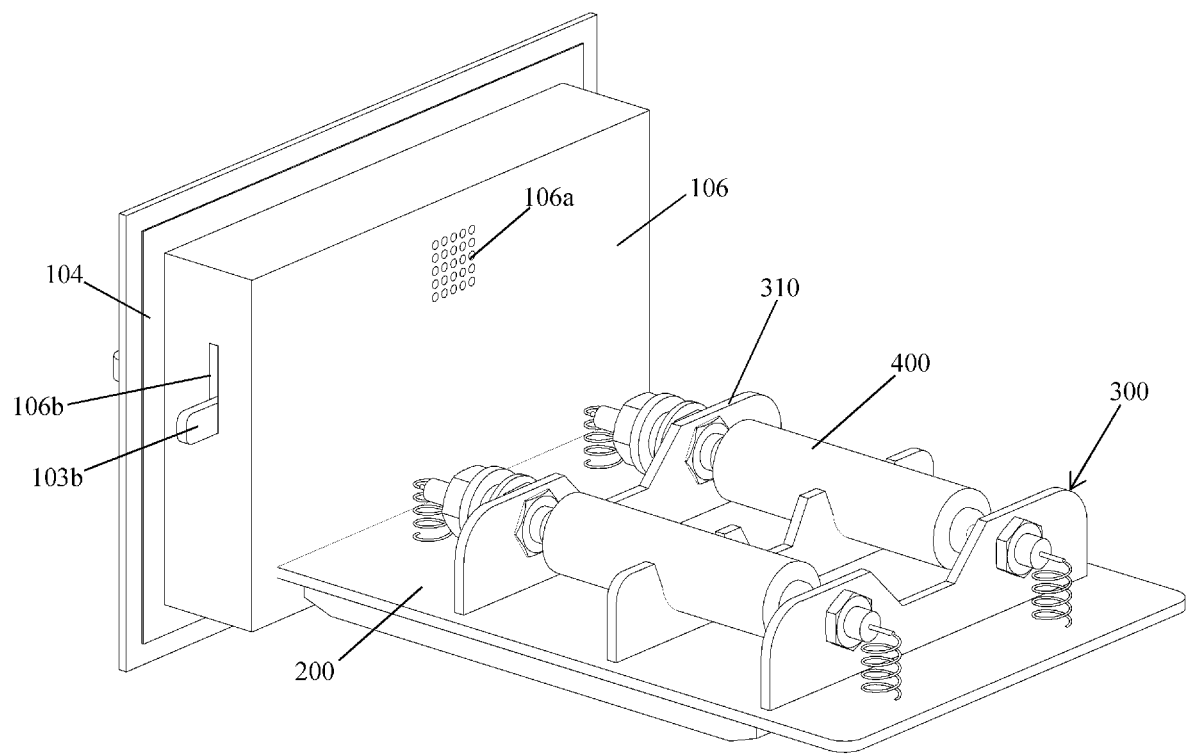
FIG. 3 is a perspective view of an explosion-proof door to which a sealing and heat insulating layer and a battery wiring assembly are mounted, according to the present invention.
Figure 4:
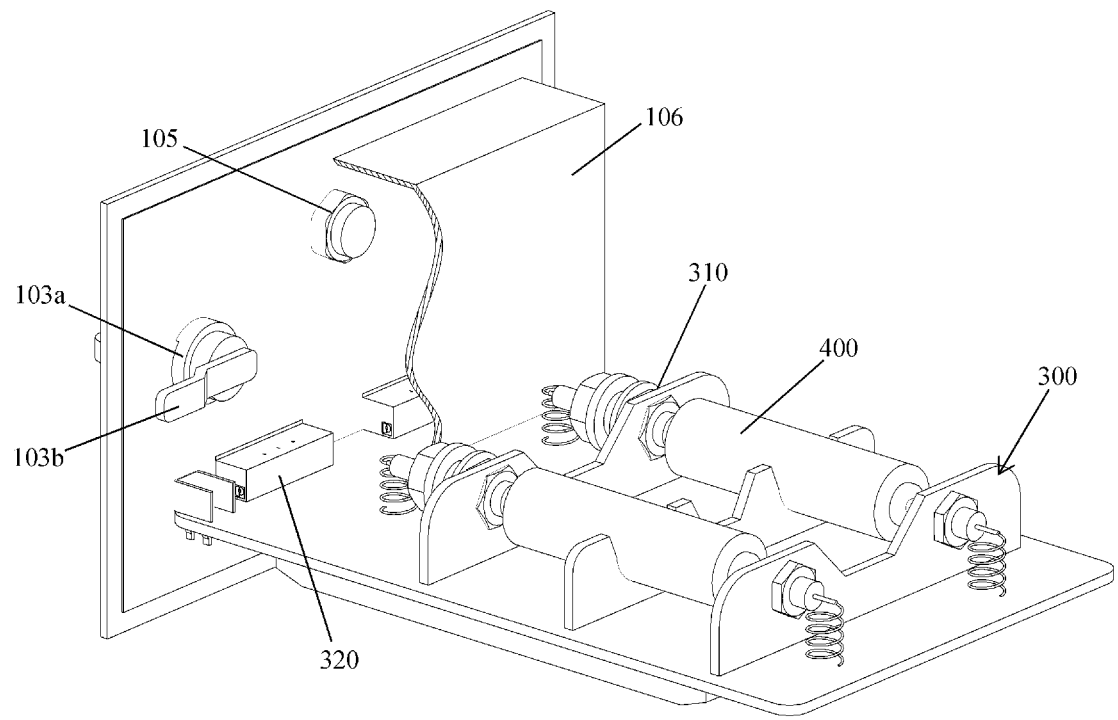
FIG. 4 is a perspective view of the explosion-proof door, the sealing and heat insulating layer and the battery wiring assembly of FIG. 3 with the sealing and heat insulating layer partially cut away to show a rotating locking lever, a pressure relief valve and a second terminal, according to the present invention.

As can be seen in FIGS. 3 and 4, a battery wiring assembly 300 is fixed to the inner side of the explosion-proof door 102. Battery wiring assembly 300 can be assembled with various existing clamp components and can be designed to accommodate different models, sizes, and types of batteries. By replacing the battery wiring assembly 300, one can test batteries of different sizes, models and types in each of the explosion-proof chambers 101. In the present embodiment, a cylindrical battery 400 is shown as an example. Any shape or type of battery can be tested, including coin, flat, pouch, box, block and universal types or shapes of batteries.

At the same time, in comparing with the existing explosion-proof test box, due to the multi-chamber independent arrangement, the volume of the entire box can be reduced, and the internal space can be fully utilized. The volume of each explosion-proof chamber is preferably less than 5 dm3. For example, in the range of 3 to 4 dm3, more than two explosion-proof chambers can be installed in a test box, and the integrated and modular design has a strong structural flexibility.

Figure 2:
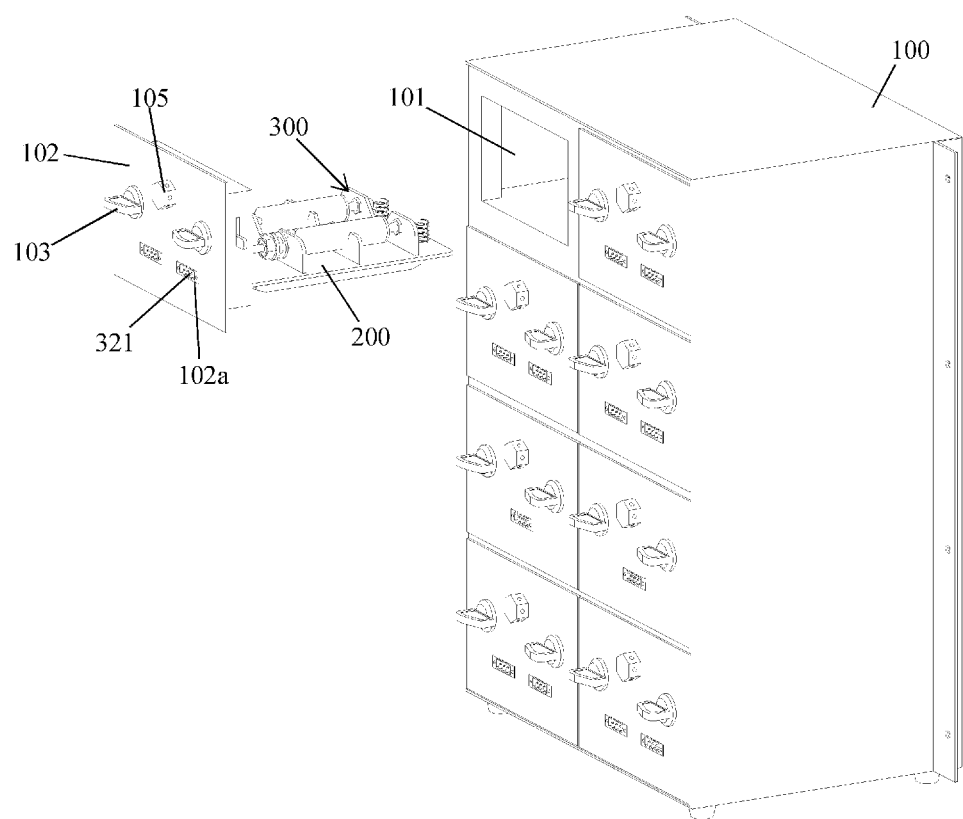
FIG. 2 is a perspective view of an explosion-proof door and a battery wiring assembly removed from an explosion-proof chamber in the multi-chamber box of FIG. 1, according to the present invention.

As shown in FIGS. 3 and 4, the battery wiring assembly 300 and the explosion-proof door 102 are assembled together to form a modular unit 102/300. The drawings show the modular unit 102/300 outside of the explosion-proof chamber 101. The modular unit 102/300 can be pulled out of the explosion-proof chamber 101 so that a battery 400 can be replaced separately without affecting battery test operations in other explosion-proof chambers. The battery wiring assembly 300 includes a first terminal 310, a second terminal 320, which is located on the inner wall of the explosion-proof door 102, and a circuit board 200 for supporting the first terminal 310. A socket 321 of the second terminal 320 is disposed on the outer wall of the explosion-proof door 102 as shown in FIG. 2. An external battery testing machine, which is not shown, can be electrically connected to battery 400 through socket 321, the second terminal 320 and the circuit board 200. A number of different connectors can be substituted for the second terminal 320 and the socket 321.

A sealing strip 104 is disposed at the edge of the inner wall of the explosion-proof door 102, and when the explosion-proof door 102 is closed, the sealing of the explosion-proof chamber 101 is achieved by pressure on the sealing strip 104. The right and left locking mechanisms 103 preferably clamp the door 102 to the frame of the box 100, which compresses the sealing strip 104 to provide an airtight seal between the door 102 and the box 100, thereby providing an enclosed and sealed space within the chamber 101. A window 102a provides an opening in the explosion-proof door 102, and the socket 321 of the second terminal 320 passes through and is received in the window 102a, preferably in a sealed engagement.

Each explosion-proof door 102 is provided with a pressure relief valve 105. When an explosion occurs in the explosion-proof chamber 101, the pressure in the explosion-proof chamber 101 increases sharply, and the pressure relief valve 105 can relieve the pressure and effectively mitigate and reduce possible damage caused by the explosion.

With reference to FIG. 3, a sealing and heat insulating layer 106 is disposed on an inner side of the explosion-proof door 102 to seal and insulate the second terminal 320, the socket 321 and the window 102a. However, vent holes 106a are disposed on the sealing and heat insulating layer 106 to allow timely pressure relief through the vent holes 106a to the pressure relief valve 105 when an explosion occurs in the chamber 101. A slot or a groove 106b is provided in a side portion of the sealing and heat insulating layer 106 through which the locking lever 103b can pass and protrude.

Figure 5:
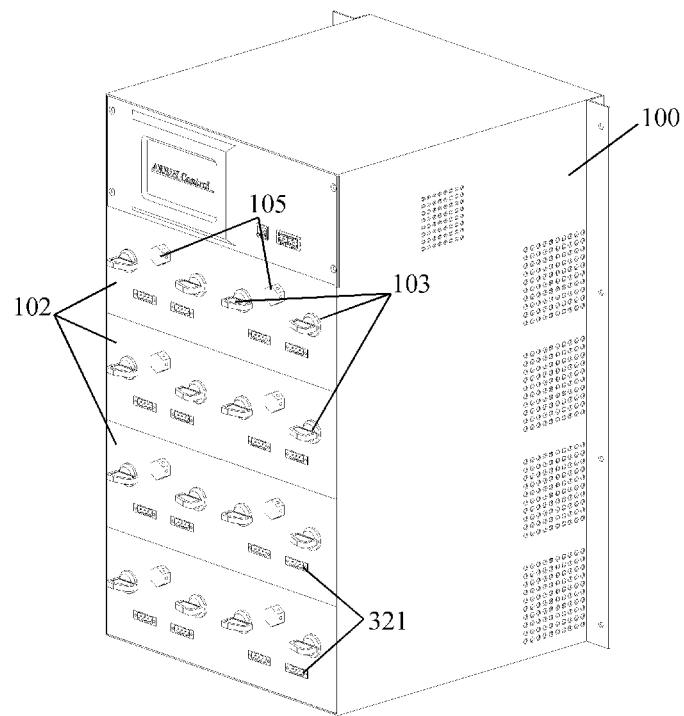
FIG. 5 is a perspective view of a multi-chamber, independent, explosion-proof, fireproof, isolated, temperature control box, according to the present invention.
Figure 6:
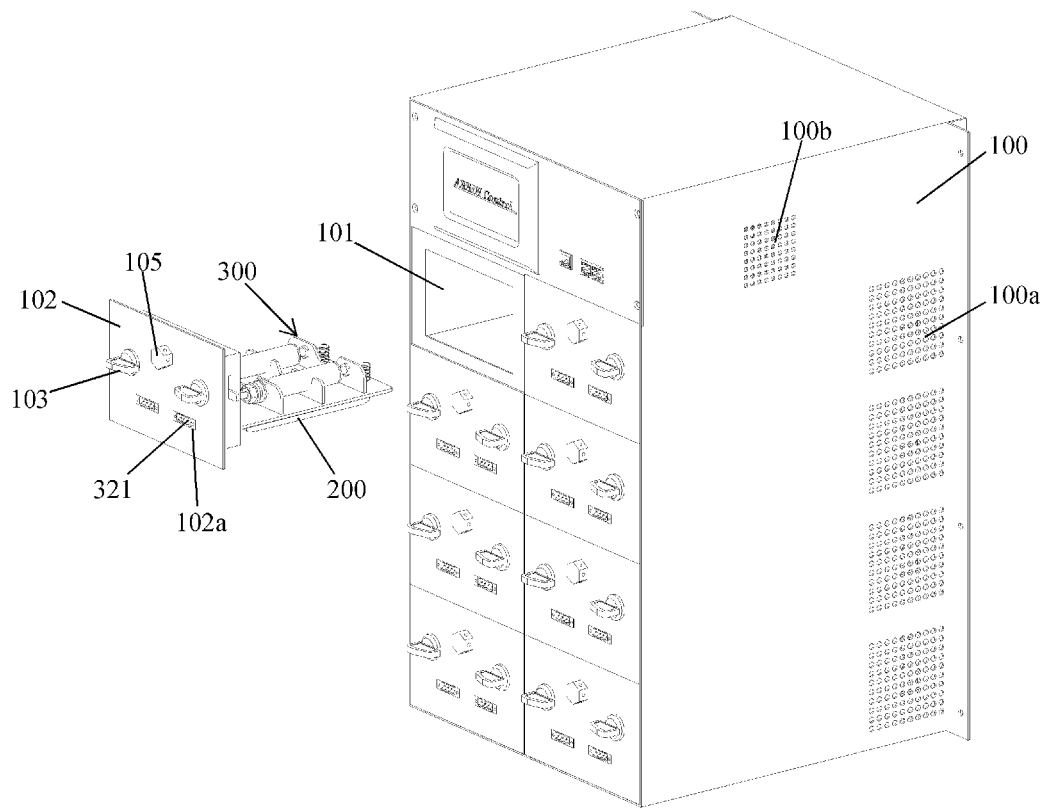
FIG. 6 is a perspective view of an explosion-proof door and a battery wiring assembly removed from an explosion-proof chamber in the multi-chamber box of FIG. 5, according to the present invention.

With reference to FIGS. 5-7, the present invention further provides a multi-chamber, independent, explosion-proof, fireproof, isolated, temperature-control box. As shown in FIG. 7, a temperature adjustment device 500 is installed in or on the back side of each of the explosion-proof chambers 101 away from the explosion-proof door 102 on the front side. Each of the temperature adjustment devices 500 is connected to the temperature control system for controlling the temperature of each explosion-proof chamber in which the temperature adjustment devices 500 are located. In this embodiment, the temperature control system, which is also referred to as a master temperature controller, is located in a control box 108, which is positioned in an upper portion of the box 100. The control box 108 includes a cooling fan, and a side wall of the control box 108 is provided with a cooling fan outlet 100b for cooling the interior of the control box 108.

Along with the above configuration, one temperature adjusting device 500 is provided in each explosion-proof chamber 101, and the temperature in each explosion-proof chamber 101 can be independently regulated. A temperature set point for each chamber 101 can be entered into the master temperature controller, which manipulates the various temperature adjusting devices 500 to maintain the temperature in the various chambers at their various set points. Tests on multiple batteries in different temperature requirements can be simultaneously performed, which greatly improves the efficiency of battery testing. An operator can use the master temperature controller to set different temperatures to be maintained in different explosion-proof chambers for testing different batteries or for testing batteries under different temperature conditions.

The temperature adjustment device 500 in this embodiment is an air conditioning device. With reference to FIG. 7, an air deflector 107 is disposed in the explosion-proof chamber 101, and the air-conditioning device and the battery wiring assembly 300 are separated by the air deflector 107. The air deflector 107 is equipped with an air inlet grille 107a and an air outlet grille 107b. An inner portion of the air-conditioning device exchanges heat through the inlet grille 107a and the outlet grille 107b, thereby realizing temperature adjustment in the explosion-proof chamber 101. At the same time, the air deflector 107 can effectively protect the air-conditioning device from direct damage during an explosion.

A heat exchange port 101a for outward heat exchange of the air conditioning device is disposed on the side wall of the explosion-proof chamber 101. The heat exchange port corresponds with a heat exchange grille 100a on the side wall of test box 100, which may be large enough for air to flow into and out of the chamber 101. An insulation layer is disposed on the inner side of the explosion-proof chamber 101 to prevent heat transfer between adjacent explosion-proof chambers 101 due to a temperature difference, which can cause the efficiency of the temperature adjustment device 500 to decrease.

With reference to FIG. 7, a temperature control wiring board 600 is mounted vertically on the back side of the box 100 away from the explosion-proof door 102 on the front side of the box 100. The temperature control wiring board 600 is provided with a wiring port 601 for each chamber 101. Each temperature adjustment device 500 is connected to one of the wiring ports 601. To install the temperature adjustment device 500, one removes the door 102 and the battery wiring assembly 300, then pushes the temperature adjustment device 500 through the explosion-proof chamber 101 and plugs it into the corresponding wiring port 601. This makes it very convenient to quickly replace the temperature adjustment device when it becomes damaged.

As shown in FIG. 8, in this embodiment, the temperature adjustment device 500 includes a semiconductor refrigeration sheet 501, with an inner heat sink 502, and an outer heat sink 503 located on both sides of the semiconductor refrigeration sheet 501 with one heat sink on each side of sheet 501.

Figure 9:
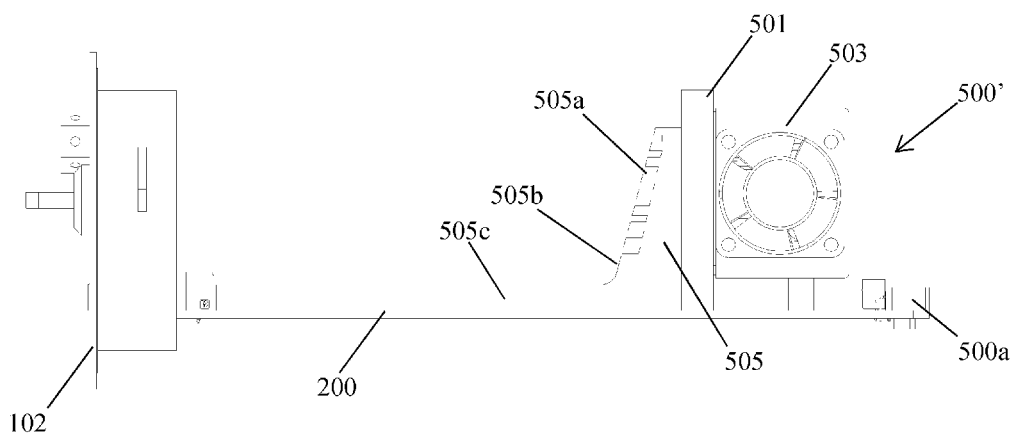
FIG. 9 is a side elevation of an explosion-proof door, a circuit board and a cooling plate device, which may be received in one chamber in a multi-chamber, independent, explosion-proof, fireproof, isolated, cooling-plate box, according to the present invention.
Figure 10:
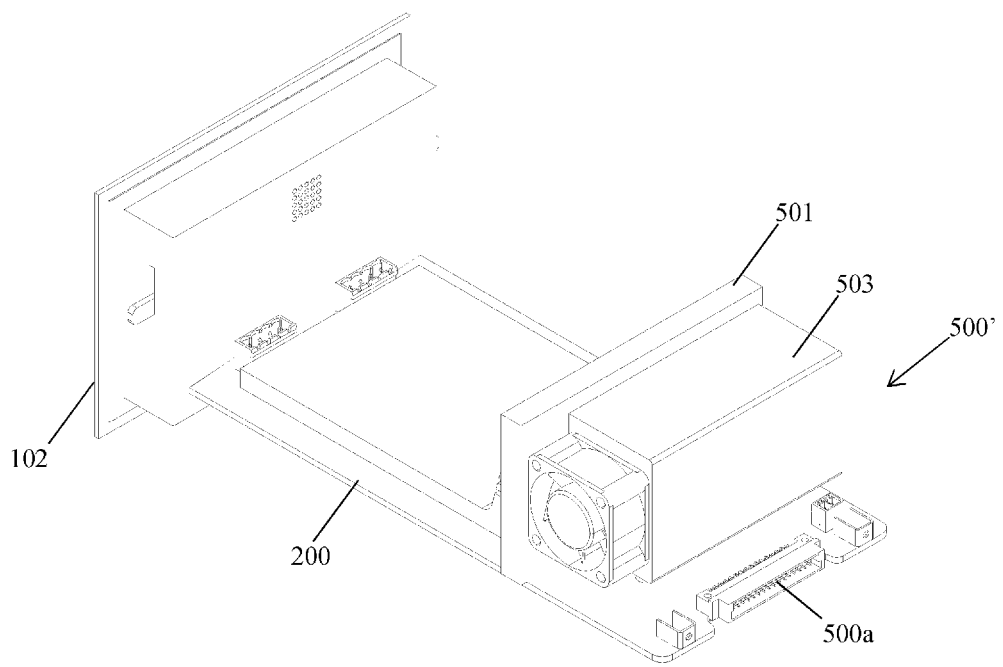
FIG. 10 is a perspective view of the modular unit shown in FIG. 9, as seen from right to left.
Figure 11:
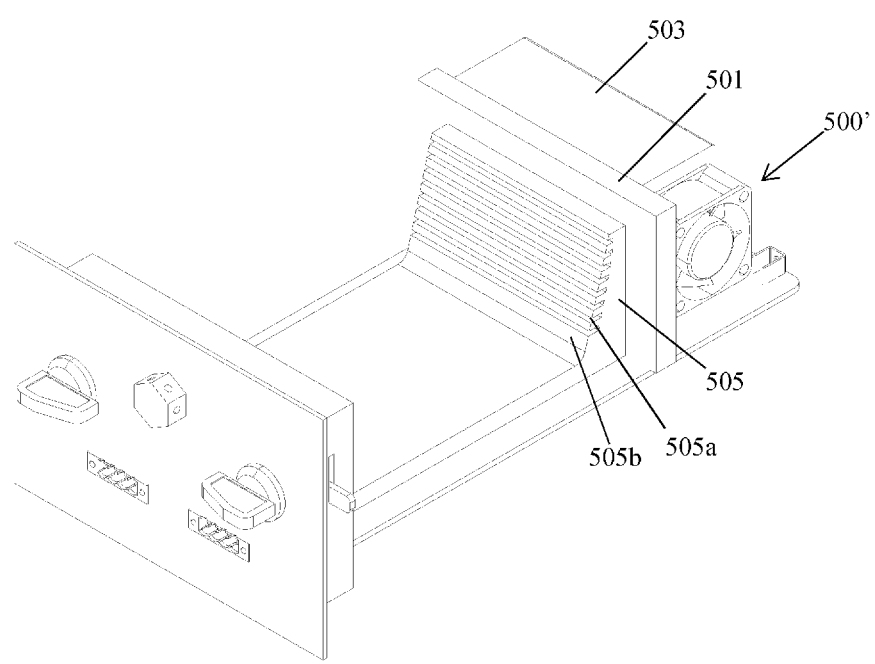
FIG. 11 is a perspective view of the modular unit shown in FIG. 9, as seen from left to right.

Turning now to FIGS. 9-11, the present invention provides a multi-chamber, independent, explosion-proof, fireproof, isolated, cooling-plate box, which provides temperature control in a different manner. In this embodiment of the invention, a cooling plate device 500' is fixedly mounted on the circuit board 200 away from or distal to the explosion-proof door 102. The cooling plate device 500' can be moved modularly with the explosion-proof door 102 and the battery wiring assembly 300. A third terminal 500a is provided on the circuit board 200, which becomes inserted into a respective wiring port 601 as the as the modular assembly is slid into one of the chambers 101. The third terminal 500a is located at the end of the circuit board 200 so that the explosion-proof door 102, the battery wiring assembly 300, and the cooling plate device 500' can be modularly removed, installed, and replaced.

In addition, in order to effectively improve the heat exchange efficiency, the cooling plate device 500' includes a semiconductor refrigeration sheet 501, a cooling plate 505 located on a side of the semiconductor refrigeration sheet 501 closer to the explosion-proof door 102, but spaced away from the explosion-proof door, and an outer heat sink 503 on the opposing or other side of the semiconductor refrigeration sheet 501. The cooling plate 505 is provided with a plurality of heat dissipation grilles 505a on the cooling plate 505. A side surface of the cooling plate 505 facing the explosion-proof door 102 is an inclined surface 505b, and the heat dissipation grille 505a is disposed on the inclined surface 505b. The lower end of the cooling plate 505 is a metal structure that is fixed to the circuit board 200, and the side opposite to the inclined surface 505b is fixed to the semiconductor refrigeration sheet 501. The arrangement of the inclined surface increases the heat transfer area, which is more favorable for heat conduction to the cooling plate, which further improves heat transfer efficiency.

With reference to FIG. 9, the cooling plate 505 also includes a horizontal plate 505c extending toward the explosion-proof door 102. With this structure, the horizontal plate 505c can effectively expand the direct heat exchange area and can exchange heat through direct contact with a battery that is being tested. When there is direct contact between the horizontal plate and the battery, there is a direct exchange of heat as compared with the first embodiment's manner of indirect heat exchange through air movement in the explosion-proof chamber. By providing direct contact with the battery, the heat exchange effect has been improved as never before, and the speed of control on battery temperatureis also improved substantially.

The temperature control wiring board 600 is provided with a wiring port 601 for each chamber 101. When an explosion occurs in a single explosion-proof chamber, even if the corresponding explosion-proof door 102, the battery connection assembly 300, and the cooling plate device 500' are all damaged, the unit can be modularly disassembled, repaired and replaced. Even though the cooling plate device 500' is directly inserted into a wiring port 601 or into a port on a temperature control wiring board 600, since the cooling plate 505 is made of a metal material, an explosion in the chamber can be effectively prevented from reaching the back wall of the chamber because the cooling plate 505 serves as a shield, thereby protecting the wiring port 601 or the temperature control wiring board 600 on the back wall of the chamber.

It is apparent that the above-described embodiments are merely examples for the sake of clarity, and are not intended to limit the embodiments. Other variations or modifications may be made by those skilled in the field of the above-described technology. There is no need and no way to describe all possible implementations. Obvious changes or variations resulting therefrom are still within the scope of the invention.

What is claimed is:

1. A battery testing apparatus, comprising:
a box having opposing front and back sides, opposing top and bottom sides, opposing left and right sides and inside dividing walls, wherein the inside dividing walls and the sides of the box define at least two chambers, and wherein the front side of the box has a framed opening for each chamber;
a door for at least one chamber; and
a battery testing apparatus mounted directly or indirectly to the door, wherein
a combined assembly comprising the battery testing apparatus mounted directly or indirectly to the door is received in one chamber such that the battery testing apparatus is inside the chamber and the door encloses the chamber.

2. The battery testing apparatus of claim 1, further comprising at least one latch for each door for fastening each door to the box, wherein each door has an inside wall that defines a front side of its respective chamber and an opposing outside wall, wherein each battery testing apparatus is attached directly or indirectly to the inside wall of its respective door, wherein each battery testing apparatus comprises a battery wiring assembly that includes a battery holder, a circuit board, a first terminal for connecting a battery to the circuit board, a second terminal connected to the circuit board and mounted directly or indirectly to the inside wall of its respective door and a socket mounted on or received in the outside wall of its respective door, wherein the socket is electrically connected to the second terminal and thereby electrically connected to the circuit board and the first terminal, thereby providing an electrical connection between a battery testing machine located outside of the box and a battery received in the battery holder.

3. The battery testing apparatus of claim 1, wherein each door and its respective battery testing apparatus slides into engagement with the box such that the battery testing apparatus is received in its respective chamber, wherein each door has two latches for fastening the door to the box without a hinge, and wherein the door, the side walls of the box and the inside dividing walls define the respective chamber for the door and are resistant to damage from an explosive event during testing of a battery in the respective chamber.

4. The battery testing apparatus of claim 1, further comprising a temperature control unit received in one or more of the chambers for controlling the temperature in its respective chamber.

5. The battery testing apparatus of claim 4, further comprising a master temperature controller electrically connected to each temperature control unit, wherein different temperatures can be maintained in different chambers.

6. The battery testing apparatus of claim 5, wherein the temperature control unit is a temperature adjusting device located distal to the door that defines the chamber in which the temperature adjusting device is received and proximate proximal to the back side of the box, and wherein the master temperature controller and the temperature adjusting device regulate the temperature of air in the respective chamber.

7. The battery testing apparatus of claim 6, further comprising a temperature control wiring board received in at least one of the chambers, which is referred to as chamber A, wherein the temperature adjusting device is a modular unit that can be pushed into chamber A through the front side of the box and plugged into the temperature control wiring board for electrical connectivity to the master temperature controller.

8. The battery testing apparatus of claim 5, wherein the battery testing apparatus includes a circuit board, and wherein the temperature control unit is a cooling-plate device mounted on or adjacent to the circuit board such that the cooling-plate device, its respective door, and its respective battery testing apparatus comprise a single unitary module that can be slid into its respective chamber.

9. The battery testing apparatus of claim 8, wherein at least a portion of the cooling-plate device is designed to provide direct contact between that portion of the cooling plate device and a battery undergoing testing.

10. The battery testing apparatus of claim 9, further comprising a temperature control wiring board received in at least one of the chambers, which is referred to as chamber B, wherein the single unitary module that comprises the cooling-plate device, its respective door, and its respective battery testing apparatus can be slid into chamber B and plugged into the temperature control wiring board for electrical connectivity to the master temperature controller.

11. The battery testing apparatus of claim 1, wherein a hinge is not used to connect the door to the box.

12. The battery testing apparatus of claim 11, further comprising a sealing strip fastened to the door for providing a seal between the door and the box.

13. The battery testing apparatus of claim 1, wherein each door has a pressure release valve, and wherein the walls of the box, the inside dividing walls of the box and each door can withstand the pressure generated by a battery explosion up to the pressure at which the pressure release valve opens.

14. The battery testing apparatus of claim 1, further comprising a temperature control unit received in at least one of the chambers for controlling the temperature in its respective chamber.

15. The battery testing apparatus of claim 1, further comprising an electrical connector in each door for connecting an external battery testing machine to the respective battery testing apparatus.

16. A multi-chamber, explosion-proof box, comprising: a box body, explosion-proof chambers arranged within the box body; an explosion-proof door for each explosion-proof chamber, wherein each door has an inner side wall and an outer side wall; and a battery wiring assembly fixed to the inner side wall of each door such that each door and its respective battery wiring assembly is a combined structure.

17. The explosion-proof box of claim 16, further comprising a socket on the outer side wall of the explosion-proof door, wherein the battery wiring assembly in each chamber comprises a circuit board, a first terminal for connecting a battery or a battery holder, and a second terminal electrically connected to the socket, wherein the socket provides a connection point for an external test line.

18. The explosion-proof box of claim 17, further comprising a pressure relief valve mounted in each door.

19. The explosion-proof box of claim 16, further comprising a temperature control unit received in at least one chamber.

20. The explosion-proof box of claim 17, wherein the box body has at least two explosion-proof chambers, wherein the combined structure of the door and its respective battery wiring assembly slides into its respective explosion-proof chamber, and wherein the door is not connected to the box body by a hinge.

21. A temperature-control box for testing batteries, comprising: a box body, a central control system, a plurality of chambers arranged within the box body; a door for each of the chambers, wherein the doors are not connected to the box body by a hinge, wherein each door has an inner side wall and an outer side wall; a battery wiring assembly mounted or fixed directly or indirectly to each inner side wall of each door; and a temperature-regulating device located in each chamber away from the door for that chamber, wherein each temperature regulating device is individually connected to the central control system, and wherein the central control system is designed and configured to regulate and maintain a desired temperature for each chamber within the box body.

22. The temperature-control box of claim 21, further comprising a socket in each door that provides an electrical connection to the respective battery wiring assembly for the door; and a pressure relief valve received in each door.

23. The temperature-control box of claim 21, wherein each door and its respective battery wiring assembly resembles a drawer that slides into one of the chambers, further comprising a latch for each door for fastening the door to the box body.

24. The temperature-control box of claim 21, wherein the temperature-regulating device comprises: a semiconductor refrigeration sheet having opposing first and second sides; an inner heat sink on the first side; and an outer heat sink on the second side.

25. The temperature-control box of claim 21, further comprising a temperature control wiring board in each chamber that is connected to the central control system, wherein the wiring board has wiring ports, and wherein the temperature-regulating device inserts into the wiring ports and thereby connects to the temperature control wiring board.

26. The temperature-control box of the claim 25, wherein each battery wiring assembly comprises: a circuit board, a first terminal or a battery holder for connecting to a battery; and a second terminal for connecting to an outside line, and wherein the second terminal is located on the outer side wall of its respective door.

27. A cooling-plate box, comprising: a box body, a central control system, a plurality of chambers that are arranged within the box body, a door for each of the chambers, wherein each door has an inner side wall and an outer side wall; a battery wiring assembly mounted or fixed directly or indirectly to each inner side wall of each door, wherein each door and its respective battery wiring assembly comprises a modular combined structure that slides into its respective chamber; a cooling-plate device located inside each chamber, wherein each cooling-plate device is individually connected to the central control system, and wherein the central control system is designed and configured to regulate a temperature for each chamber.

28. The cooling-plate box of claim 27, wherein each battery wiring assembly comprises: a circuit board, a first terminal or a battery holder for connecting to a battery and a second terminal for connecting to an outside line, and wherein the second terminal is located on the outer side wall of its respective door.

29. The cooling-plate box of claim 28, wherein each cooling-plate device is connected to the circuit board of its respective battery wiring assembly.

30. The cooling-plate box of claim 29, wherein the cooling-plate device is mounted on its respective battery wiring assembly, thereby providing a modular structure that includes one door, one battery wiring assembly and one cooling-plate device.

31. The cooling-plate box of claim 30, further comprising a temperature control wiring board having multiple wiring ports within each chamber located away from the door for the respective chamber, wherein the respective battery wiring assembly plugs into the respective wiring ports, thereby connecting the cooling-plate device to the temperature control wiring board.

32. The cooling-plate box of claim 31, wherein each battery wiring assembly has a proximal end that is adjacent to its respective door and a distal end that is spaced away from its respective door, further comprising a third terminal mounted on the distal end of the battery wiring assembly, wherein the third terminal is positioned on its respective modular structure such that the third terminal slides and inserts directly into the wiring ports of the respective temperature control wiring board.

33. The cooling-plate box of claim 30, further comprising a pressure relief valve received in each door, wherein the cooling-plate device comprises: a semiconductor refrigeration sheet having opposing first and second sides; an inner heat sink on the first side; and an outer heat sink on the second side.

34. The cooling-plate box of claim 33, wherein each cooling-plate device comprises a horizontal plate having one end adjacent to and an opposing end spaced away from the door, wherein the battery wiring assembly is directly connected to the horizontal plate, and wherein the horizontal plate is designed for direct contact and heat transfer with a battery being tested.

35. The cooling-plate box of claim 34, wherein each horizontal plate has a holding slot corresponding to the shape of a battery to be tested for receiving and holding the battery in direct contact with the horizontal plate, thereby allowing direct heat transfer between the battery and the horizontal plate.

36. The cooling-plate box of claim 27, wherein each cooling-plate device comprises a horizontal plate having one end adjacent to and an opposing end spaced away from the door, wherein the battery wiring assembly is directly connected to the horizontal plate, and wherein the horizontal plate is designed and configured for direct contact and heat transfer with a battery being tested.

\* \* \* \* \*